(12) United States Patent
Feng et al.

(10) Patent No.: US 12,049,998 B2
(45) Date of Patent: Jul. 30, 2024

(54) LATE CONFIGURABLE LED MODULE AND VEHICLE HEADLIGHT

(71) Applicant: LUMILEDS LLC, San Jose, CA (US)

(72) Inventors: Chentian Feng, Shanghai (CN); Xiaoke Ren, Shanghai (CN); Jun Zhang, Shanghai (CN)

(73) Assignee: LUMILEDS, LLC, San Jose, CA (US)

( * ) Notice: Subject to any disclaimer, the term of this patent is extended or adjusted under 35 U.S.C. 154(b) by 120 days.

(21) Appl. No.: 17/870,553

(22) Filed: Jul. 21, 2022

(65) Prior Publication Data

US 2023/0025975 A1 Jan. 26, 2023

Related U.S. Application Data

(60) Provisional application No. 63/231,569, filed on Aug. 10, 2021.

(51) Int. Cl.
| | |
|---|---|
| *F21V 19/00* | (2006.01) |
| *F21V 23/00* | (2015.01) |
| *F21V 29/70* | (2015.01) |
| *F21Y 115/10* | (2016.01) |

(52) U.S. Cl.
CPC ........ *F21V 19/0025* (2013.01); *F21V 23/003* (2013.01); *F21V 29/70* (2015.01); *F21Y 2115/10* (2016.08)

(58) Field of Classification Search
CPC ..... F21V 19/0025; F21V 29/70; F21V 23/003
See application file for complete search history.

(56) References Cited

U.S. PATENT DOCUMENTS

| | | | |
|---|---|---|---|
| 8,172,434 B1* | 5/2012 | Olsson | F21V 29/58 |
| | | | 362/249.02 |
| 9,209,353 B2* | 12/2015 | Radermacher | F21K 9/00 |
| 9,267,650 B2* | 2/2016 | Simon | F21K 9/275 |
| 2009/0141493 A1 | 6/2009 | Stoyan | |
| 2010/0061025 A1* | 3/2010 | Parker | G09F 13/22 |
| | | | 362/249.02 |
| 2011/0068696 A1 | 3/2011 | van de Ven et al. | |
| 2011/0211351 A1* | 9/2011 | Van De Ven | F21V 29/74 |
| | | | 362/249.02 |
| 2011/0242805 A1 | 10/2011 | Jin et al. | |
| 2011/0310624 A1* | 12/2011 | Preuschl | F21K 9/23 |
| | | | 362/373 |
| 2011/0315956 A1* | 12/2011 | Tischler | H01L 33/36 |
| | | | 257/E33.048 |
| 2012/0146066 A1* | 6/2012 | Tischler | H05B 45/30 |
| | | | 257/89 |

(Continued)

OTHER PUBLICATIONS

International Search Report and Written Opinion mailed Nov. 21, 2022 for PCT International Application No. PCT/US2022/037886.

*Primary Examiner* — Bryon T Gyllstrom
(74) *Attorney, Agent, or Firm* — Volpe Koenig

(57) ABSTRACT

A device is described that includes a carrier that has a plurality of light-emitting diode (LED) mounting areas. Each of the LED mounting areas includes a pair of contact pads, which are electrically coupled to the LED mounting area in a first subset of the plurality of LED mounting areas or electrically connected in series with a shunting element in the respective LED mounting area in a second subset of the plurality of LED mounting areas. In some embodiments, LEDs may be placed in the first subset of the plurality of LED mounting areas.

20 Claims, 9 Drawing Sheets

(56) References Cited

U.S. PATENT DOCUMENTS

| | | | |
|---|---|---|---|
| 2013/0077299 A1* | 3/2013 | Hussell | H05B 47/10 |
| | | | 362/249.02 |
| 2015/0124437 A1* | 5/2015 | Van De Ven | F21S 8/033 |
| | | | 362/184 |
| 2015/0285474 A1 | 10/2015 | Martin et al. | |
| 2015/0369435 A1 | 12/2015 | Bauer et al. | |
| 2018/0187877 A1* | 7/2018 | Hsia | F21V 25/04 |
| 2019/0017672 A1 | 1/2019 | Duarte et al. | |
| 2020/0182426 A1 | 6/2020 | Droegeler | |

* cited by examiner (a)

(b)

(a)

(b)

(a)

(b)

LATE CONFIGURABLE LED MODULE AND VEHICLE HEADLIGHT

CROSS REFERENCE TO RELATED APPLICATIONS

This application claims the benefit of U.S. Provisional Patent Application No. 63/231,569, which was filed on Aug. 10, 2020, and International Patent Application Number PCT/CN2021/107705, which was filed on Jul. 21, 2021, the contents of which are hereby incorporated by reference herein.

BACKGROUND

Light emitting diodes (LEDs), which may include any or all semiconductor light emitting devices, including, for example, diode lasers, are more frequently replacing older technology light sources due to superior technical properties, such as energy efficiency and lifetime. This may be true even for demanding applications, such as in terms of luminance, luminosity, and/or beam shaping (e.g., vehicle headlighting). For delivering high lumen output, typically, more than one LED may be required, which LEDs may, for example, be arranged in an array pattern. Additionally, despite their energy efficiency, LEDs, such as high power LEDs, may still develop considerable heat requiring cooling, such as by connecting the LED to a heatsink, to keep LED junction temperatures low.

SUMMARY

A device is described that includes a carrier that has a plurality of light-emitting diode (LED) mounting areas. Each of the LED mounting areas includes a pair of contact pads, which are electrically coupled to the LED mounting area in a first subset of the plurality of LED mounting areas or electrically connected in series with a shunting element in the respective LED mounting area in a second subset of the plurality of LED mounting areas. In some embodiments, LEDs may be placed in the first subset of the plurality of LED mounting areas.

BRIEF DESCRIPTION OF THE DRAWINGS

A more detailed understanding can be had from the following description, given by way of example in conjunction with the accompanying drawings wherein.

DETAILED DESCRIPTION

Figure 1:
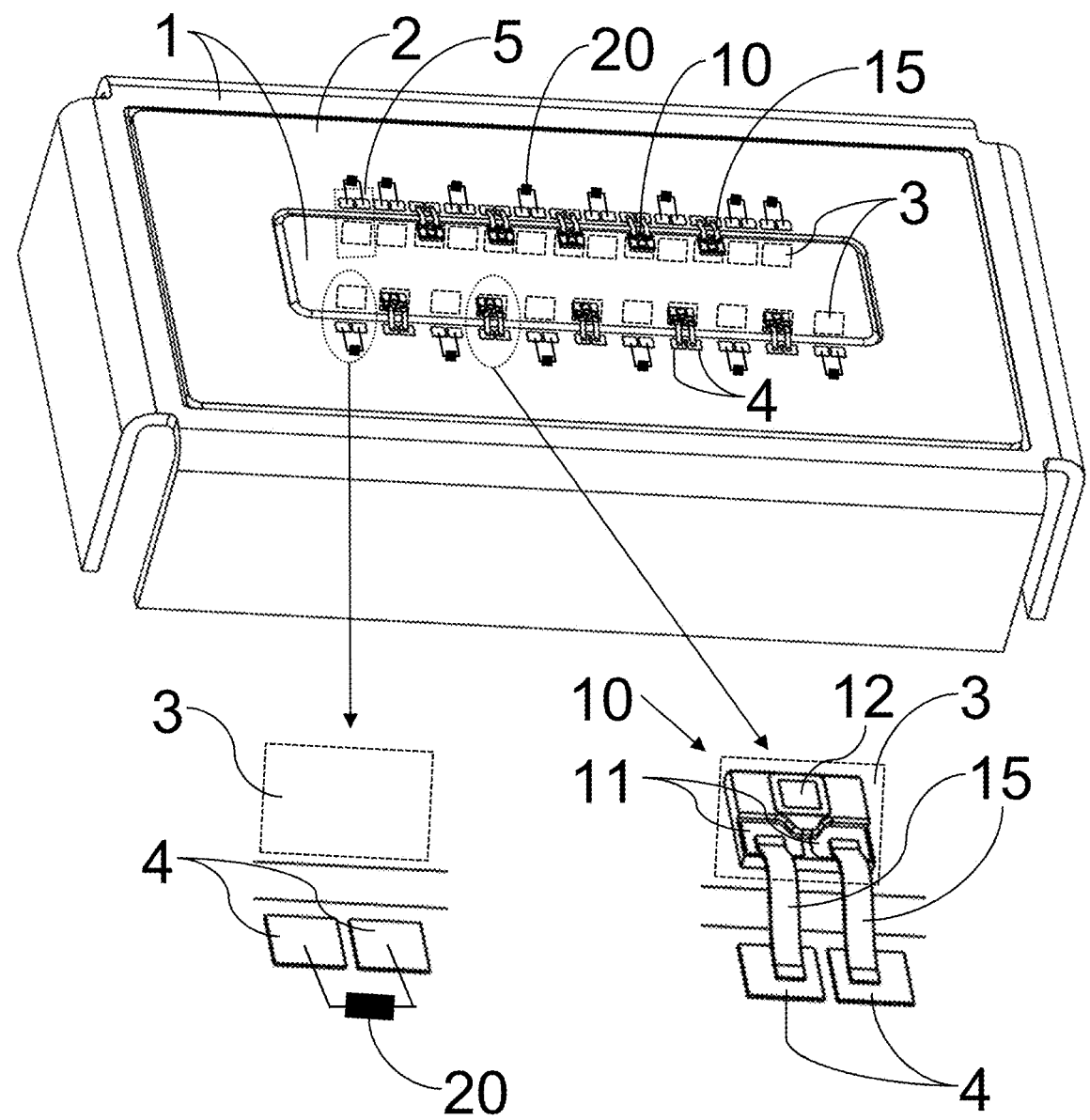
FIG. 1 is a schematic perspective view of an example LED module.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

As already remarked, for high lumen applications, such as vehicle headlighting, high power LEDs may need to be used in multitude to deliver the required luminous flux. To do so, typically, these LEDs may be placed close to each other, such as in an array pattern. Besides yielding the required luminous flux, however, using multiple LEDs may also offer further design options. For example, by selecting appropriate LEDs, for example, with respect to size of light emitting area, luminance, and luminous flux, and by selecting the relative arrangement of the LEDs, such as with respect to inter-LED distances (or LED density) and the overall shape of the light source, the characteristics of the LED light source can be largely varied. Thus, besides the design of the optical systems imaging the LEDs, for example, on a road ahead of a vehicle, the design of the LED light source characteristics may be heavily employed.

When designing vehicle headlights, design aspects may be considered in addition to technical considerations. Car manufacturers consider the lighting features of a vehicle an important differentiator from competition. Not surprisingly, there are many different headlighting systems in the market that also differ strongly in the layout of the LED light sources.

In manufacturing an LED module, the LEDs may be placed on a carrier, such as a circuit board or a lead frame, incorporating at least some of the electrical circuitry required for operating the LEDs and, more frequently and more directly on a heatsink (to which the electrical circuitry may then be added as a separate component) to improve cooling, especially of high power LEDs. Modifying an LED module, such as by changing type or number of LEDs, or changing their relative spatial arrangement (inter-LED distances and relative placement), may typically require a complete redesign of the full LED module, the heatsink, and, the electrical circuitry (e.g., the circuit board or lead frame). With such redesign, the previous manufacturing tools may not be used, or at least may need substantial changes. For example, stamping or molding tools for the heatsinks may need to be changed or newly made, and contact pads and connection lines on circuit boards may need to be relocated, typically requiring, for example, new print matrices for the circuit boards. Such need for a serious redesign and the need for new or at least seriously adapted manufacturing tools, in light of the many LED light source shapes each with low production volume, may not provide economy of scale.

To at least alleviate such situation, embodiments described herein provide for a design platform for LED modules. In embodiments described herein, the design platform may include a layout of an LED module holding the potential for realizing many different shapes and luminance distributions of an LED light source and where the particular characteristics of a targeted LED light source for a specific application can be late configured. The proposed LED module, thus, can be manufactured in a unified manner using the same tools for many different final variants.

FIG. 1 is a schematic perspective view of an example LED module. In the example illustrated in FIG. 1, a heatsink 1 has been stamped out of a sheet metal and has a largely planar upper face and down-bended side faces. On the planar upper face of the heatsink 1, a circuit board 2, such as a printed circuit board (PCB) or an encapsulated lead frame, may provide the electrical connections for the LED module and carry electrical components other than the LEDs 10. In its middle part, the circuit board 2 may have a cutout exhibiting the central part of the upper face of the heatsink 1 where, arranged in a two-row array, the LED mounting areas 3 may be placed. In at least some of these mounting areas 3, LEDs 10, for optimal thermal contact, may be mounted directly onto the heatsink 1, such as by gluing or by using a thermal pad. On the circuit board 2, in a one-to-relationship to the mounting areas 3 (indicated by the conceptual grouping 5), pairs of contact pads 4 may be placed, such that each pair of contact pads 4 is opposite to its corresponding LED mounting area 3.

Better recognizable in the enlarged details in the lower part of FIG. 1, in some of the mounting areas 3, LEDs 10 (with light emitting area 12) may be mounted that have electrodes 11 that are electrically connected, such as by ribbon bonds 15, to the contact pads 4 of its corresponding pair of contact pads 4. The other LED mounting areas 3 are empty. However, the contact pads 4 of the pairs of contact pads 4 corresponding to such empty mounting areas 3 may be electrically connected with each other via a shunting element 20. The (not shown) electrical connections of circuit board 2 may electrically connect the pairs of contact pads 4 into a series, which series connection, thus, may result in a series connection of the LEDs 10 and shunting elements 20.

The disclosure, thus, proposes to manufacture a kind of "standardized" carrier (in FIG. 1, the heatsink 1) with LED mounting positions 3, and a "standardized" electrical circuitry (in FIG. 1, comprised by the circuit board 2) comprising pairs of contact pads 4 in a one-to-one correspondence 5 to the LED mounting areas 3, and connecting the pairs of contact pads 4 into an electrical series connection. Then, in a late configuration step, the designer can decide which LEDs 10 to place where. For example, only in such late configuration step does the designer needs to select the types of LEDs to employ, such as in terms of size of light emitting area, luminance, and luminous flux, and to select which mounting areas 3 to place these LEDs 10 in, thus determining the shape of the area the LEDs 10 are mounted to and their mounting density within that area (the inter-LED distance).

While the carrier and electrical circuitry can be identical for many applications, and, thus, can be mass manufactured, the placement of the LEDs 10 and connecting their electrodes 11 via, for example, ribbon bonds 15 to the contact pads 4 of their corresponding pair of contact pads, and the placement (and connection) of the shunting elements 20 to the contact pads 4 of the remaining pairs of contact pads may be performed using standard pick and place and, for example, solder processes in semiconductor manufacturing. The embodiments described herein, thus, not only simplify the design process by reducing the degrees of freedom of where to place LEDs 10 but, even more important, transform the formerly required customized manufacturing processes into standard mass manufacturing ones.

If using a circuit board 2 for accommodating the electrical circuitry, like in FIG. 1, such circuit board 2 may be chosen to be, for example, a standard FR4 PCB, or an Insulated Metal Substrate (IMS) board if the circuit board should support heat distribution and dissipation of the components mounted on the circuit board. Instead of an IMS board, an encapsulated lead frame may be used. Instead of a circuit board 2 (or lead frame) separate from a heatsink 1, as shown in FIG. 1, these two components may also be integrated. For example, one may use a carrier for mounting the LEDs as well as for comprising the electrical circuitry (and mounting the shunting elements). In such latter case, a lead frame or an IMS thermally coupled to an underlying heatsink may be particularly advantageous.

Figure 2:
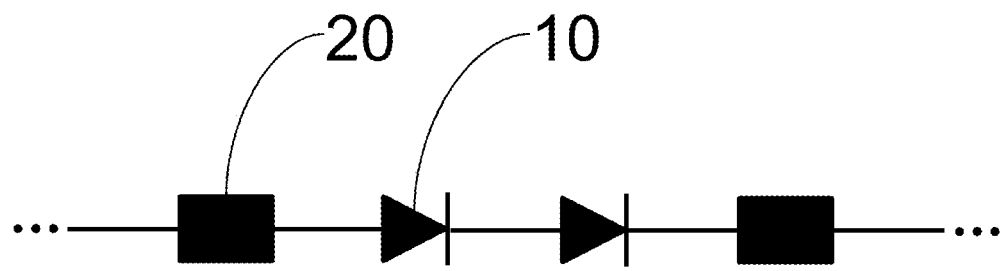
FIG. 2 is a circuit diagram of a series connection between LEDs and shunting elements of the LED module of FIG. 1.

FIG. 2 is a circuit diagram of a series connection between LEDs and shunting elements of the LED module of FIG. 1. The shunting elements 20 may serve the purpose of closing the series connection between the LEDs 10 as, otherwise, the contact pads 4 of the contact pad pairs having no associated LED 10 would lead to an open circuit.

For such shortcutting, zero-ohm resistors may be an advantageous choice for the shunting elements 20. However, basically, closed switches, fixed value non-zero-ohm resistors, and controllable varistors would work as well. Such switches, fixed value non-zero-ohm resistors and controllable varistors, however, may even further enhance the late (or even in operation only) configurability of the LED module examples described herein. For that, in some embodiments, such an element may be added as a further shunting element 20 parallel to a mounted LED 10. The further shunting element 20 may then be electrically coupled between the contact pads 4 of a contact pad pair that is already connected by ribbon bonds 15 to the electrodes 11 of an LED 10.

Figure 3:
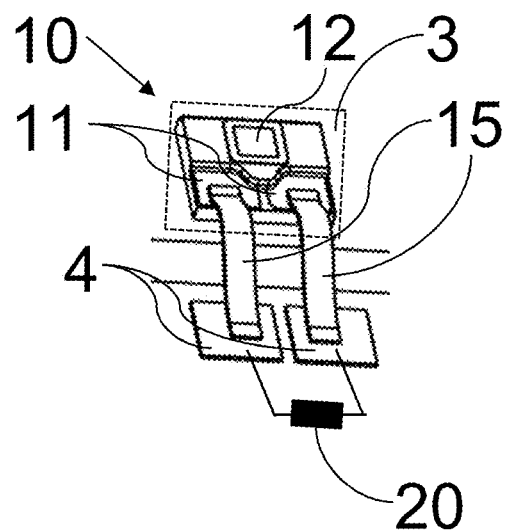
FIG. 3 is a schematic diagram of a portion of another example LED module.

In such situation, the further shunting element 20 may open a parallel (shunting) current path as a bypass to such LED 10. FIG. 3 is a schematic diagram of a portion of another example LED module in which the shunting element 20 opens a parallel current path bypassing LED 10. Choosing a switch for the further shunting element 20 may allow for short cutting (or fully bypassing) the LED 10, and, thus, would yield single addressability for the LED 10. Using a fixed value non-zero-ohm resistor for the further shunting element 20 may reduce the current through the LED 10, and, thus, also the brightness of the LED 10. This may be particularly useful if a single type of LED is to be mounted to the carrier 1 where the designer may desire less brightness for this part of the LED light source. A controllable varistor for the further shunting element 20 may even allow full, in operation changeable, brightness control from zero over intermediate values to full brightness of the LED 10.

Using such variant may allow an even further unification of the manufacture of the LED module. For that, LEDs 10 may be placed in all mounting areas 3. Then, only the placement of the shunting elements 20 (and the nature chosen for the shunting elements 20) may determine which LEDs 10 operate and how they operate on powering the LED module. Using, for example, zero-ohm resistors (jumpers) may, thus, allow late configuration of which LEDs to shortcut and which to operate.

For in-operation control of the mounted LEDs 10, the electrical circuitry may further include a controller for switches and/or varistors employed for such further shunting elements 20. Such a controller, in an embodiment as shown in FIG. 1, may be mounted on the circuit board 2 to yield a compact module. Furthermore, an electrical connector could also be added to the electrical circuitry, for example by mounting onto the circuit board 2. Via such connector, the LED module may be contacted to circuitry of the device taking up the LED module (e.g., it may be connected to the board electronics of a car incorporating the LED module in its headlights).

The functionality of an LED module according to the embodiments described herein may be further enhanced by adding primary and/or secondary optics processing the light emitted by the mounted LEDs in operation. A primary optic, such as a set of collimators with each collimator close to and in front of its corresponding LED, might be useful for relatively far distanced LEDs (e.g., with inter-LED distances ≥200 μm). The light leaving the primary optic may be imaged, for example, onto a road in front of a vehicle by a secondary optic, in the simplest case, for example, by a single projection lens. With denser spaced LEDs, a primary optic may be dispensable and the complete optical processing might be done by an appropriately configured secondary optic alone.

For vehicle headlight applications, the LED mounting areas might be arranged in an array with one or more rows. After such an LED module has been received by a lamp fixture of the vehicle headlight, such rows might be horizontal. Adding more LEDs in a row, then, might allow broader beams where varying the LED density (inter-LED distances) between the row center and the row borders might allow to vary the brightness between the road middle and the road borders and beyond.

Figure 4:
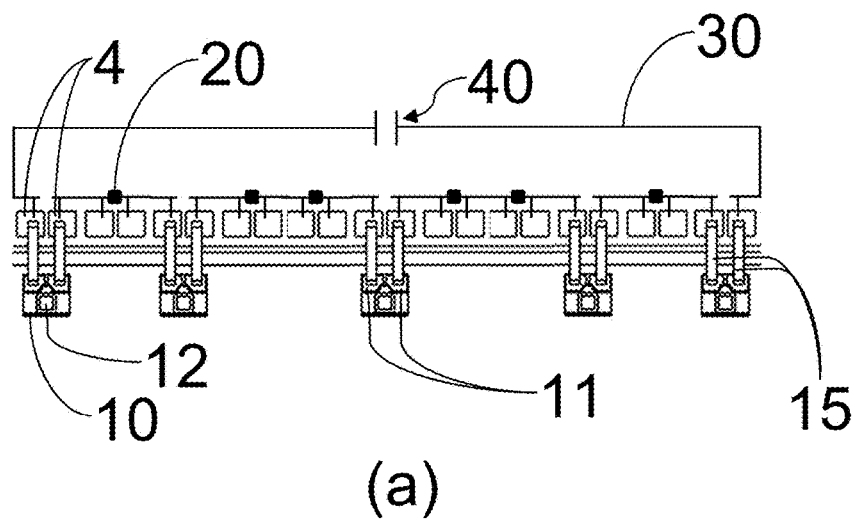
FIGS. 4 to 6 are schematic diagrams of various LED arrangements for a vehicle headlight and their resulting brightness distributions ahead of the vehicle.
Figure 4:
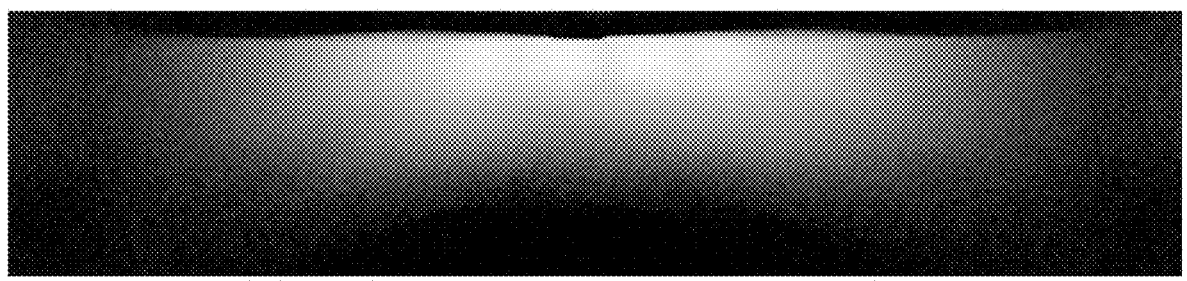
Figure 5:
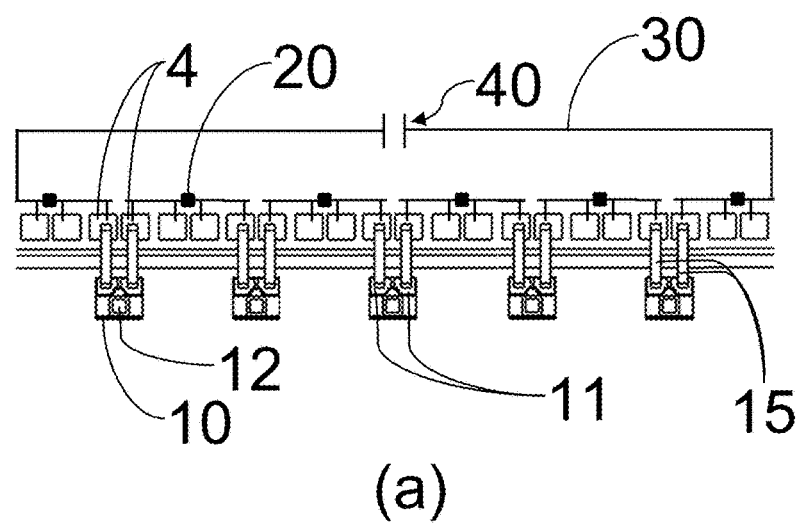
Figure 5:
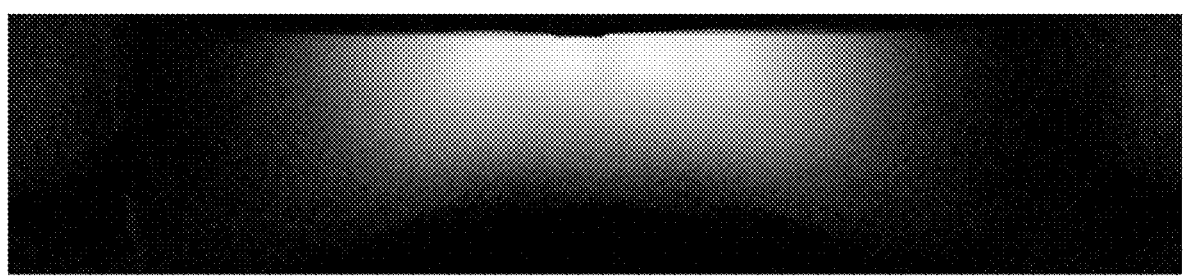
Figure 6:
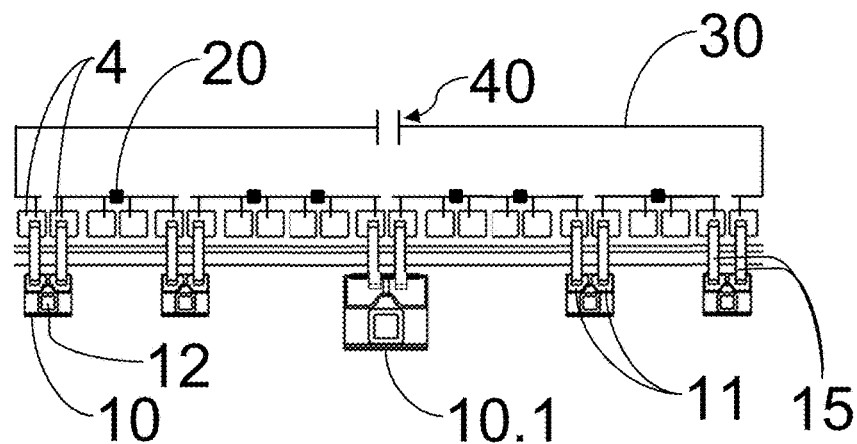
Figure 6:

FIGS. 4 to 6 are schematic diagrams of various LED arrangements for a vehicle headlight and their resulting brightness distributions ahead of the vehicle with the LED mounting areas 3 omitted for clarity. In their upper parts (a), these Figures show three arrangements of LEDs 10 in a horizontal row of such an array for a vehicle headlight. In their lower parts (b), they show the brightness distribution obtained by these LED arrangements on a vertical screen placed ahead of the vehicle. All three situations show a vertical beam range from 0° to −20° and a horizontal beam range from −50° to +50°.

In FIG. 4, the LED density is thinned out in the middle of the row, somewhat reducing the brightness in the middle of the vehicle's road lane for the benefit of enhancing the brightness at and beyond the road borders. The embodiment illustrated in FIG. 5, instead, employs a constant LED density in the middle as well as at the borders. Employing the same number five of LEDs 10 as in FIG. 4 may mean that the left and right outermost pairs of contact pads 4 have no LEDs 10. Accordingly, the brightness distribution in FIG. 5 may have higher intensity in the middle of the vehicle's road lane at the expense of a narrower brightness profile (i.e., less light at and beyond the road borders). FIG. 6, again, has the same LED arrangement as FIG. 4 (i.e., a thinned out LED density in the middle of the row). However, to make good for the brightness reduction resulting in FIG. 4 for the middle of the vehicle's road lane, FIG. 6 employs a more powerful LED 10.1 in the row center than at the other LED mounting positions 3. For that, one might, for example, select a center LED 10.1 with a larger light emitting area 12 and/or one with higher luminance.

FIGS. 4 to 6 also show the circuit lines 30 (e.g., printed on a circuit board 2) connecting the LEDs 10 and shunting elements 20 in series and the current source 40 powering the LEDs 10. Here, the circuit lines 30 may include the connections from the contact pads 4 to the mounting positions of the shunting elements 20 for all of the pairs of contact pads 4. For the sake of late configurability and economy of scale in mass manufacturing, these connections may be included in the electrical circuitry from the very start where their additional cost may be negligible.

Figure 7:
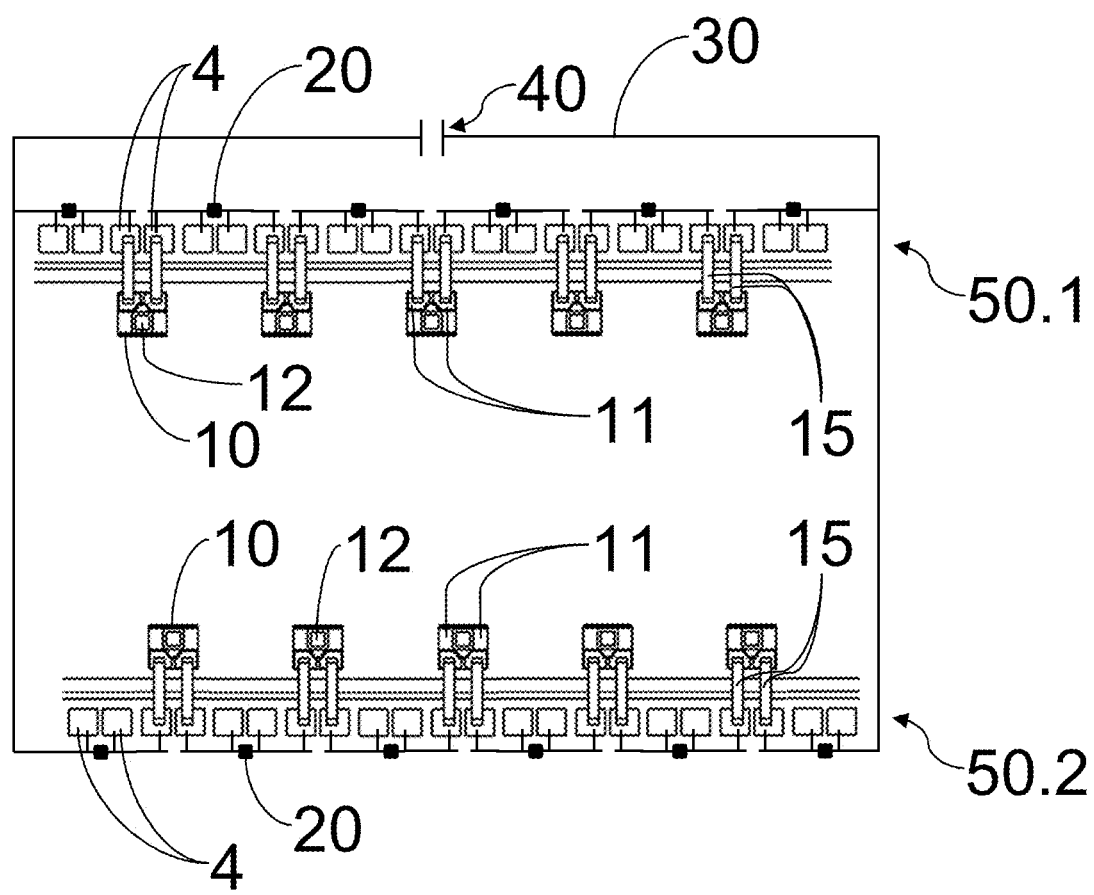
FIG. 7 is a schematic diagram of an example parallel connection of two series connections of the LED module of FIG. 1 or 3.

In a further embodiment of an LED module, one may combine more than one series connection of the contact pad pairs and connect these series connections parallel to each other. FIG. 7 is a schematic diagram of an example parallel connection of two series connections of the LED module of FIG. 1 or 3. In the example illustrated in FIG. 7, a first series connection 50.1 of LEDs 10 and shunting elements 20 and a further series connection 50.2 of LEDs 10 and shunting elements 20 are provided. The two series connections 50.1, 50.2 may then be electrically coupled in parallel to each other by connection lines 30 to current source 40. Such a setup might be useful if, for sufficient luminous flux, more LEDs 10 are needed than can be usefully accommodated in a single series connection.

In doing such parallel connection of the two series connections 50.1, 50.2 in FIG. 7, the spatial layout has been chosen in a way that the arrangement of FIG. 1 could be continued to be used. In other words, the LEDs 10 could be mounted on the planar upper face of a heatsink 1 exposed by a central cutout of a circuit board 2 comprising the electrical circuitry (with the pairs of contact pads 4, the shunting elements 20, and the connection lines 30).

Figure 8:
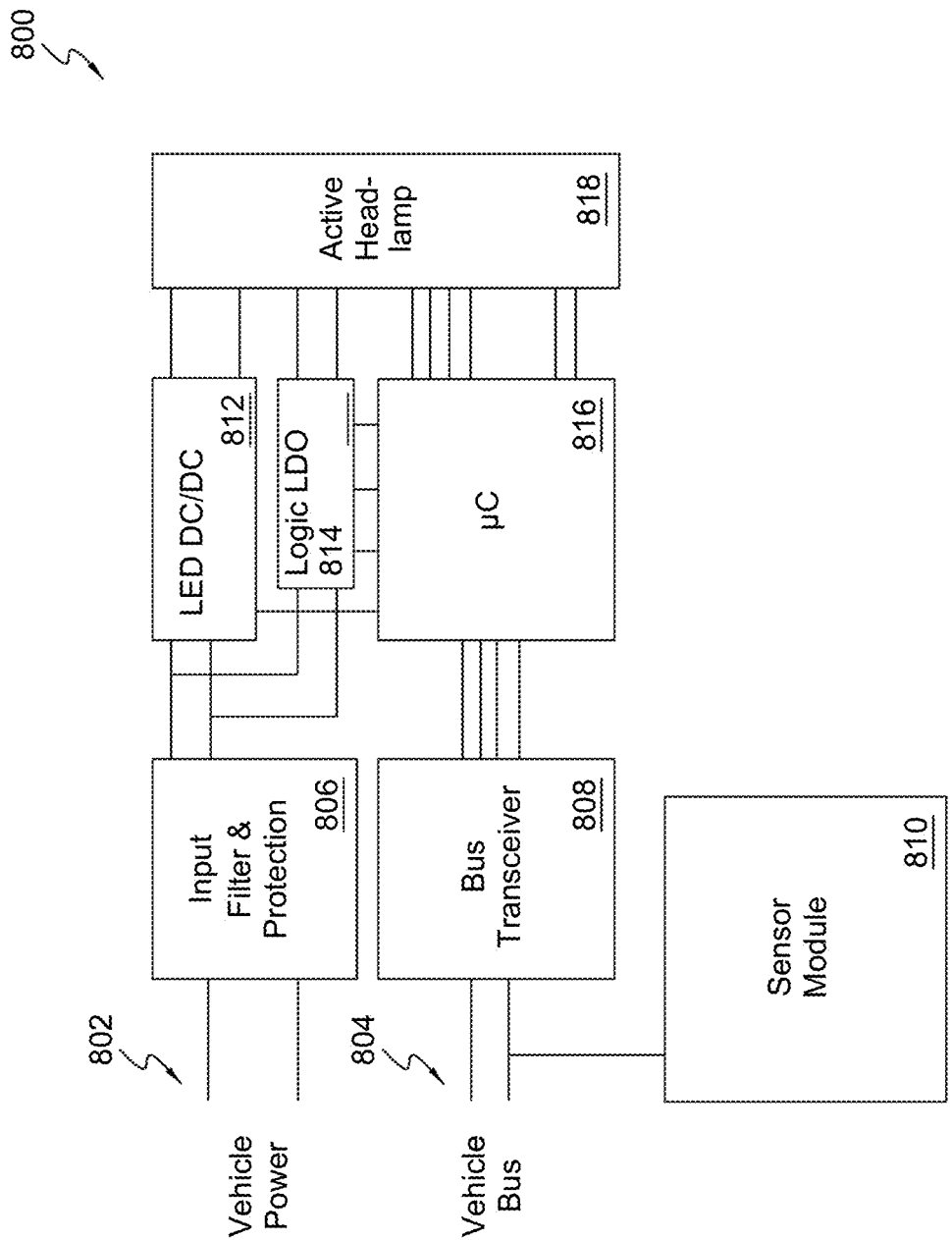
FIG. 8 is a diagram of an example vehicle headlamp system.

FIG. 8 is a diagram of an example vehicle headlamp system 800 that may incorporate one or more of the embodiments and examples described herein. The example vehicle headlamp system 800 illustrated in FIG. 8 includes power lines 802, a data bus 804, an input filter and protection module 806, a bus transceiver 808, a sensor module 810, an LED direct current to direct current (DC/DC) module 812, a logic low-dropout (LDO) module 814, a micro-controller 816 and an active head lamp 818.

The power lines 802 may have inputs that receive power from a vehicle, and the data bus 804 may have inputs/outputs over which data may be exchanged between the vehicle and the vehicle headlamp system 800. For example, the vehicle headlamp system 800 may receive instructions from other locations in the vehicle, such as instructions to turn on turn signaling or turn on headlamps, and may send feedback to other locations in the vehicle if desired. The sensor module 810 may be communicatively coupled to the data bus 804 and may provide additional data to the vehicle headlamp system 800 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 800. In FIG. 8, the headlamp controller may be a micro-controller, such as micro-controller (pc) 816. The micro-controller 816 may be communicatively coupled to the data bus 804.

The input filter and protection module 806 may be electrically coupled to the power lines 802 and may, for example, support various filters to reduce conducted emissions and provide power immunity. Additionally, the input filter and protection module 806 may provide electrostatic discharge (ESD) protection, load-dump protection, alternator field decay protection, and/or reverse polarity protection.

The LED DC/DC module 812 may be coupled between the input filter and protection module 106 and the active headlamp 818 to receive filtered power and provide a drive current to power LEDs in the LED array in the active headlamp 818. The LED DC/DC module 812 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 814 may be coupled to the input filter and protection module 806 to receive the filtered power. The logic LDO module 814 may also be coupled to the micro-controller 816 and the active headlamp 818 to provide power to the micro-controller 816 and/or electronics in the active headlamp 818, such as CMOS logic.

The bus transceiver 808 may have, for example, a universal asynchronous receiver transmitter (UART) or serial peripheral interface (SPI) interface and may be coupled to the micro-controller 816. The micro-controller 816 may translate vehicle input based on, or including, data from the sensor module 810. The translated vehicle input may include a video signal that is transferrable to an image buffer in the active headlamp 818. In addition, the micro-controller 816 may load default image frames and test for open/short pixels during startup. In embodiments, an SPI interface may load an image buffer in CMOS. Image frames may be full frame, differential or partial frames. Other features of micro-controller 816 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 9:
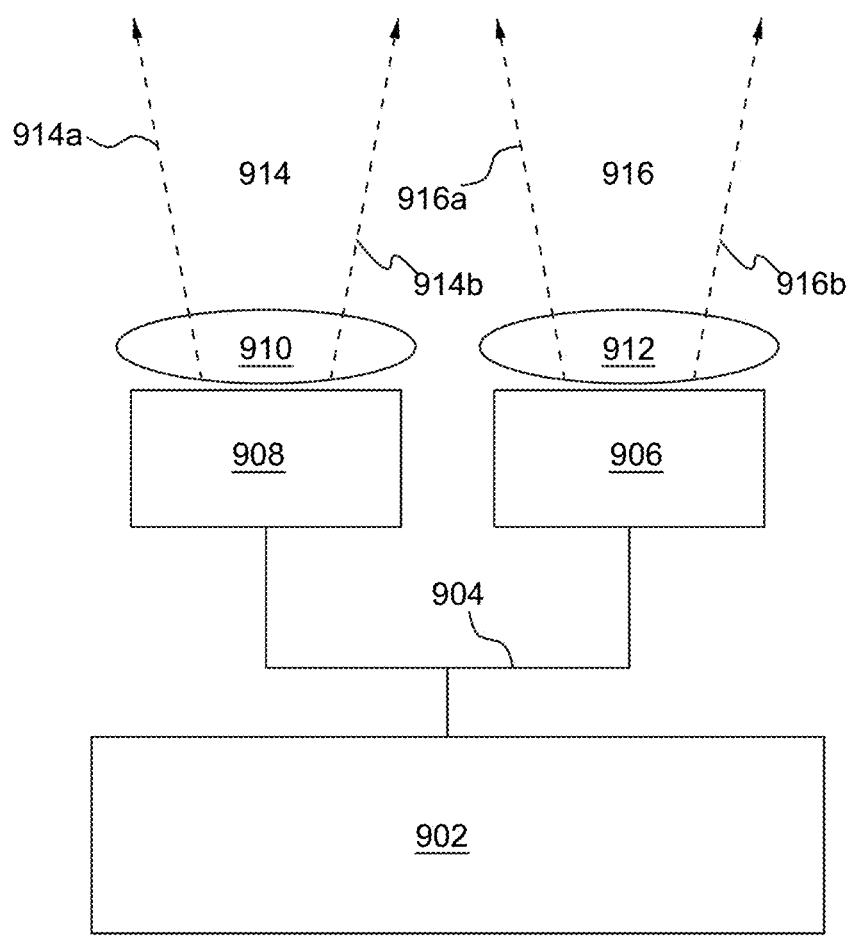
FIG. 9 is a diagram of another example vehicle headlamp system.

FIG. 9 is a diagram of another example vehicle headlamp system 800. The example vehicle headlamp system 900 illustrated in FIG. 9 includes an application platform 902, two LED lighting systems 906 and 908, and secondary optics 910 and 912.

The LED lighting system 908 may emit light beams 914 (shown between arrows 914a and 914b in FIG. 9). The LED lighting system 906 may emit light beams 916 (shown between arrows 916a and 916b in FIG. 9). In the embodiment shown in FIG. 9, a secondary optic 910 is adjacent the LED lighting system 908, and the light emitted from the LED lighting system 908 passes through the secondary optic 910. Similarly, a secondary optic 912 is adjacent the LED lighting system 906, and the light emitted from the LED lighting system 906 passes through the secondary optic 912. In alternative embodiments, no secondary optics 910/912 are provided in the vehicle headlamp system.

Where included, the secondary optics 910/912 may be or include one or more light guides. The one or more light guides may be edge lit or may have an interior opening that defines an interior edge of the light guide. LED lighting systems 908 and 906 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 908 and 906 in a desired manner, such as, for example, with a gradient, a chamfered distribution, a narrow distribution, a wide distribution, or an angular distribution.

The application platform 902 may provide power and/or data to the LED lighting systems 906 and/or 908 via lines 904, which may include one or more or a portion of the power lines 802 and the data bus 904 of FIG. 9. One or more sensors (which may be the sensors in the vehicle headlamp system 900 or other additional sensors) may be internal or external to the housing of the application platform 902. Alternatively, or in addition, as shown in the example vehicle headlamp system 800 of FIG. 8, each LED lighting system 908 and 906 may include its own sensor module, connectivity and control module, power module, and/or LED array.

In embodiments, the vehicle headlamp system 900 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 906 and 908 may be sensors (e.g., similar to sensors in the sensor module 810 of FIG. 8) that identify portions of a scene (e.g., roadway or pedestrian crossing) that require illumination.

Figure 10:
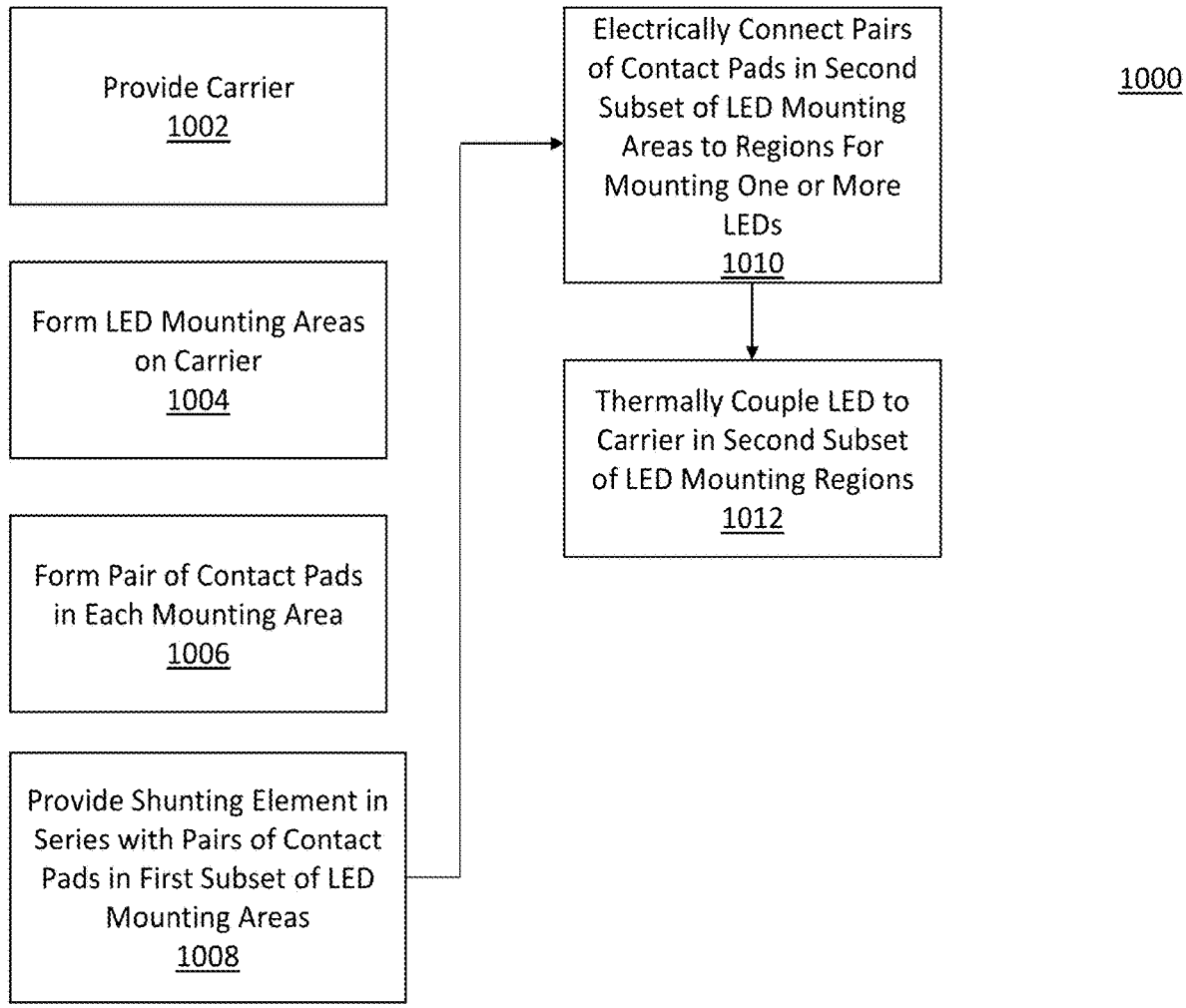
FIG. 10 is flow diagram of an example method of manufacturing device or LED module.

FIG. 10 is a flow diagram 1000 of an example method of manufacturing device or LED module. In the example illustrated in FIG. 10, a carrier is provided (1002). LED mounting area may be formed on the carrier (1004). A pair of contact pads may be formed in each mounting area (1006). A shunting area may be provided and electrically connected in series with the pair of contact pads in a first subset of the LED mounting areas (1008). In a second subset of the LED mounting areas, the pairs of contact pads may be electrically connected to regions for mounting one or more LEDs (1010). In some embodiments, LEDs may be thermally coupled to the carrier in the second subset of LED mounting regions to form a complete LED device. In embodiments in which the device or LED module is used in an automotive lighting system, such as headlights, the device or LED module may be mounted to a lamp fixture in which a primary optic and a secondary optic may be contained and aligned with the device or LED module.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A device comprising:
   a carrier comprising:
      a plurality of light-emitting diode (LED) mounting areas each comprising a region for mounting one or more LEDs, and
      a plurality of pairs of contact pads, each of the plurality of pairs being disposed adjacent a respective one of the plurality of LED mounting areas,
   wherein, for a first subset of the plurality of LED mounting areas, each of the plurality of pairs of contact pads is electrically coupled to a respective one of the plurality of LED mounting areas, and
   wherein, for a second subset of the plurality of LED mounting areas, each of the plurality of pairs of contact pads is electrically connected in series with a shunting element and not electrically connected to any of the plurality of mounting areas.

2. The device of claim 1, wherein the carrier further comprises a heat sink, and the region for mounting the one or more LEDs is directly on the heat sink.

3. The device of claim 1, further comprising one of a circuit board or a lead frame comprising at least the shunting element and any electrical circuitry forming the series connection between the pair of contact pads.

4. The device of claim 3, wherein the circuit board is selected from one of an IMS board and an FR4 PCB.

5. The device according to claim 1, wherein the shunting element is one or more of a switch, a zero-ohm resistor, a fixed value non-zero-ohm resistor, or a controllable varistor.

6. The device according to claim 1, further comprising:
   a plurality of further light-emitting diode (LED) mounting areas on the carrier, each of the further LED mounting areas comprising:
      a further pair of contact pads, and
      the further pair of contact pads being electrically coupled to the further LED mounting area in a further first subset of the plurality of further LED mounting areas or electrically connected in series with a shunting element in the respective further LED mounting area in a further second subset of the plurality of LED mounting areas; and
   electrical circuitry establishing an electrical parallel connection between a series connection of the plurality of mounting areas and the plurality of further mounting areas.

7. A light-emitting diode (LED) module comprising:
   a carrier comprising a plurality of light-emitting diode (LED) mounting areas, each of the LED mounting areas comprising:
      a pair of contact pads,
      at least one LED on a first subset of the LED mounting areas and adjacent and electrically coupled to the pair of contact pads, and
      a shunting element electrically coupled in series at least between the pair of contact pads in a second subset of the LED mounting areas, wherein no LEDs are disposed on the second subset of the LED mounting areas.

8. The LED module of claim 7, wherein:
   the carrier comprises a heat sink, and
   the at least one LED is thermally coupled to the heat sink in the first subset of the LED mounting areas.

9. The LED module of claim 7, further comprising one of a circuit board or a lead frame comprising at least the shunting element and any electrical circuitry forming the series connection between the pair of contact pads.

10. The LED module of claim 7, wherein the pair of mounting pads in each of the LED mounting areas in the first subset is electrically coupled to the respective LED in the respective LED mounting area.

11. The LED module according to claim 7, wherein each of the LED mounting areas in the first subset further comprises a further shunting element electrically connected between the pair of contact pads.

12. The LED module according to claim 7, wherein the shunting element is one or more of a switch, a zero-ohm resistor, a fixed value non-zero-ohm resistor, or a controllable varistor.

13. The LED module according to claim 7, wherein the at least one LED comprises a plurality of LEDs, at least one of which differs in one or more of size of light emitting area, luminance or luminous flux.

14. The LED module according to claim 7, wherein the LED mounting areas are arranged in an array with one or more rows.

15. The LED module according to claim 14, wherein a density of the LEDs in the middle of a row of the rows of the array is different from a density of the LEDs at a border of the row.

16. The LED module according to claim 7, further comprising:
   a plurality of further light-emitting diode (LED) mounting areas on the carrier, each of the further LED mounting areas comprising:
      a further pair of contact pads,
      at least one further LED on a further first subset of the further LED mounting areas and adjacent the further pair of contact pads, and
      electrical circuitry comprising a further shunting element electrically coupled in series at least between the further pair of contact pads in a further second subset of the further LED mounting areas, wherein no LEDs are disposed on the further second subset of the further LED mounting areas; and
   additional electrical circuitry establishing an electrical parallel connection between a series connection of the plurality of mounting areas and the plurality of further mounting areas.

17. The LED module according to claim 7, further comprising a controller configured to control the shunting element.

18. The LED module according to claim 7, further comprising an electrical connector for the shunting element and any circuitry for making the series connection.

19. A vehicle headlight comprising:
   a lamp fixture; and
   an LED module mounted to the lamp fixture, the LED module comprising:
      a carrier comprising a plurality of light-emitting diode (LED) mounting areas, each of the LED mounting areas comprising:
         a pair of contact pads, at least one LED on a first subset of the LED mounting areas,
and adjacent the pair of contact pads, and
a shunting element electrically coupled in series at least between the pair of contact pads in a second subset of the LED mounting areas, wherein no LEDs are disposed on the second subset of the LED mounting areas.

20. The vehicle headlight according to claim 19, further comprising:
a primary optic close to all of the at least one LED; and
a secondary optic.

* * * * *